US012117810B2

(12) United States Patent
Lu et al.

(10) Patent No.: US 12,117,810 B2
(45) Date of Patent: Oct. 15, 2024

(54) AI-BASED DETERMINATION OF ACTION PLAN FOR MANUFACTURING COMPONENT CARRIERS

(71) Applicant: AT&S Austria Technologie & Systemtechnik Aktiengesellschaft, Leoben (AT)

(72) Inventors: Tim Lu, Chongqing (CN); Peter Wang, Chongqing (CN)

(73) Assignee: AT&S Austria Technologie &Systemtechnik AG, Leoben (AT)

( * ) Notice: Subject to any disclaimer, the term of this patent is extended or adjusted under 35 U.S.C. 154(b) by 0 days.

(21) Appl. No.: 17/443,927

(22) Filed: Jul. 28, 2021

(65) Prior Publication Data

US 2022/0043435 A1 Feb. 10, 2022

(30) Foreign Application Priority Data

Aug. 7, 2020 (CN) .............................. 202010790022

(51) Int. Cl.
| | |
|---|---|
| *G05B 19/418* | (2006.01) |
| *G05B 13/02* | (2006.01) |
| *H01L 21/67* | (2006.01) |

(52) U.S. Cl.
CPC ..... *G05B 19/41865* (2013.01); *G05B 13/027* (2013.01); *H01L 21/67276* (2013.01); *G05B 2219/31053* (2013.01)

(58) Field of Classification Search
None
See application file for complete search history.

(56) References Cited

U.S. PATENT DOCUMENTS

| | | | |
|---|---|---|---|
| 5,439,160 | A | 8/1995 | Marcantonio |
| 5,655,110 | A | 8/1997 | Zoran et al. |
| (Continued) | | | |

FOREIGN PATENT DOCUMENTS

| | | |
|---|---|---|
| CN | 109831881 A | 5/2019 |
| EP | 3352013 A1 | 7/2018 |
| (Continued) | | |

OTHER PUBLICATIONS

Abbing, R.; Extended European Search Report in 21187752.7; pp. 1-11; Dec. 17, 2021; European Patent Office; 80298, Munich Germany.

(Continued)

*Primary Examiner* — Jason Lin
(74) *Attorney, Agent, or Firm* — Robert A. Blaha; Smith Tempel Blaha LLC

(57) ABSTRACT

A method of planning the manufacture of component carriers includes defining a set of final product parameters as a target for component carriers to be manufactured, ranking the process parameters concerning their impact on the final product parameters, selecting a subset of higher ranked process parameters, inputting the selected subset of process parameters for processing by an artificial intelligence module, and determining an action plan for the manufacturing based on an output of the artificial intelligence module, where the product parameters are influenceable by a set of process parameters settable during the manufacturing method.

16 Claims, 7 Drawing Sheets

(56) References Cited

U.S. PATENT DOCUMENTS

| | | | |
|---|---|---|---|
| 6,614,540 B1* | 9/2003 | Stirton | G03F 7/70625 356/237.1 |
| 7,009,704 B1* | 3/2006 | Nikoonahad | G01B 11/272 356/399 |
| 10,769,320 B2* | 9/2020 | Kuznetsov | G03F 7/70641 |
| 2003/0220709 A1* | 11/2003 | Hartman | G06N 20/00 700/121 |
| 2007/0100487 A1 | 5/2007 | Chang et al. | |
| 2014/0172394 A1* | 6/2014 | Kuznetsov | G03F 7/70625 703/6 |
| 2016/0148850 A1* | 5/2016 | David | G03F 7/70625 355/53 |
| 2016/0246185 A1* | 8/2016 | Ypma | G03F 7/70508 |
| 2016/0313651 A1* | 10/2016 | Middlebrooks | G06N 20/00 |
| 2017/0330072 A1 | 11/2017 | Iao et al. | |
| 2018/0113974 A1 | 4/2018 | Boday et al. | |
| 2018/0358271 A1 | 12/2018 | Drue | |
| 2019/0369503 A1* | 12/2019 | Ypma | G05B 19/41875 |
| 2021/0389677 A1* | 12/2021 | Lin | G05B 19/41875 |

FOREIGN PATENT DOCUMENTS

| | | |
|---|---|---|
| EP | 3650939 A1 | 5/2020 |
| KR | 101777547 B1 | 9/2017 |

OTHER PUBLICATIONS

Albing, R.; Communication Pursuant to Article 94(3) EPC in Application No. 21187752.7; pp. 1-12; Oct. 6, 2023; European Patent Office, Postbus 5818, 2280 HV Rijswijk, Netherlands.

Lee, J.H et al.; A New Intelligent SOFM-based Sampling Plan for Advanced Process Control, Expert Systems With Applications; pp. 133-151, Feb. 2001, vol. 20, No. 2, Elsevier, Amsterdam, NL, XP027377832.

* cited by examiner

AI-BASED DETERMINATION OF ACTION PLAN FOR MANUFACTURING COMPONENT CARRIERS

CROSS-REFERENCE TO RELATED APPLICATION

The present application claims the benefit of the filing date of the Chinese Patent Application No. 202010790022.8, filed Aug. 7, 2020, the disclosure of which is hereby incorporated herein by reference.

TECHNICAL FIELD

Embodiments of the invention generally relate to the manufacture of component carriers, an apparatus for determining an action plan for manufacturing component carriers, a computer-readable medium, and a program element.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Planning the manufacture of component carriers is conventionally carried out by engineers. However, it may happen that the manufactured component carriers show undesired properties, resulting in yield loss.

SUMMARY

There may be a need to manufacture component carriers with high yield and reasonable effort.

According to an exemplary embodiment of the invention, a method of planning manufacture of component carriers is provided, wherein the method comprises defining a set of final product parameters as a target for component carriers to be manufactured, wherein the product parameters are influenceable by a set of process parameters being settable during the manufacturing method, ranking the process parameters concerning their impact on the final product parameters, selecting a subset of higher ranked process parameters, inputting the selected subset of process parameters for processing by an artificial intelligence module, and determining an action plan for the manufacturing method based on an output of the artificial intelligence module.

According to another exemplary embodiment of the invention, an apparatus for determining an action plan for manufacturing component carriers is provided, wherein the apparatus comprises a receiving unit (for instance comprising an input/output interface and/or a correspondingly operated and/or programmed processor or part thereof, and optionally a memory) configured for receiving a defined set of final product parameters as a target for component carriers to be manufactured and for receiving a set of process parameters, wherein the product parameters are influenceable by the set of process parameters being settable during the manufacturing method, a ranking unit (for instance comprising an input/output interface and/or a correspondingly operated and/or programmed processor or part thereof, and optionally a memory) configured for ranking the process parameters concerning their impact on the final product parameters, a selection unit (for instance comprising an input/output interface and/or a correspondingly operated and/or programmed processor or part thereof, and optionally a memory) configured for selecting a subset of higher ranked process parameters, an artificial intelligence module (for instance comprising an input/output interface and/or a correspondingly operated and/or programmed processor or part thereof, and optionally a memory) configured for processing the selected subset of process parameters using artificial intelligence, and a determining unit (for instance comprising an input/output interface and/or a correspondingly operated and/or programmed processor or part thereof, and optionally a memory) configured for determining an action plan for the manufacturing method based on an output of the artificial intelligence processing.

According to still another exemplary embodiment of the invention, a program element (for instance a software routine, in source code or in executable code) is provided, which, when being executed by a processor (such as a microprocessor or a CPU), is adapted to control and/or carry out a method having the above-mentioned features.

According to yet another exemplary embodiment of the invention, a computer-readable medium (for instance a CD, a DVD, a USB stick, an SD card, a floppy disk or a hard disk, or any other (in particular also smaller) storage medium) is provided, in which a computer program is stored which, when being executed by a processor (such as a microprocessor or a CPU), is adapted to control and/or carry out a method having the above-mentioned features.

Data processing which may be performed according to embodiments of the invention can be realized by a computer program, that is by software, or by using one or more special electronic optimization circuits, that is in hardware, or in hybrid form, that is by means of software components and hardware components.

Overview of Embodiments

In the context of the present application, the term "component carrier" may particularly denote any support structure which is capable of accommodating one or more components thereon and/or therein for providing mechanical support and/or electrical connectivity and/or optical connectivity and/or thermal connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "artificial intelligence" may particularly denote tools such as neural networks, self-learning or self-adaptive systems, fuzzy logic, etc. Artificial intelligence may operate independently of human beings on the basis of electronic hardware and software resources. Correspondingly, an artificial intelligence module may be a physical or a virtual entity including artificial intelligence capabilities. Artificial intelligence may particularly denote the implementation of algorithms and/or statistical models that a processor (such as a computer system) may use to perform a specific task without using explicit instructions, relying on patterns, or the like. In particular, artificial intelligence algorithms may build a mathematical model based on input data (which may also be denoted as training data) in order to make predictions or decisions without being explicitly programmed to perform the task.

In the context of the present application, the term "final product parameters" may particularly denote a set of target properties or parameters of a readily manufactured component carrier. For instance, final product parameters may characterize a component carrier manufactured in accordance with a predefined specification. In particular, final product parameters may not be input to a manufacturing process as input parameters, but may in contrast to this define a desired output of the manufacturing process, i.e., a result to be achieved.

In the context of the present application, the term "process parameters" may particularly denote a set of input parameters which may be adjusted from a user side in terms of designing and defining a method of manufacturing component carriers, i.e. which may be used for controlling machines for manufacturing component carriers. A goal of the artificial intelligence module may be to determine a set of process parameters allowing to achieve the set of final product parameters of component carriers manufactured based on the determined set of process parameters.

In the context of the present application, the term "action plan" may particularly denote a sequence of instructions, commands, processes and specific measures which may be taken for actually carrying out a manufacturing process. An action plan may thus be an algorithm of practically operating a manufacturing device for manufacturing component carriers. In particular, the action plan may be indicative of how to carry out the manufacturing method to achieve compliance with the defined set of final product parameters.

According to an exemplary embodiment of the invention, a system for determining an improved manufacturing method for manufacturing component carriers is provided which involves one or more elements of artificial intelligence (AI), for instance a neural network. Correspondingly, an AI-based predictive model for predicting desired properties of manufactured component carriers may be provided. A corresponding manufacture planning system may initially define final product parameters characterizing the actually manufactured component carriers, as a set of target parameters being indicative of target properties of the manufactured component carriers. Correspondingly, a set of process parameters may be defined which can be adjusted from a user side or from an exterior side during the manufacturing process, i.e., are directly accessible to a user impact. The process parameters may thus also be denoted as input parameters for the manufacturing process. Descriptively speaking, changing the process parameters may have an indirect impact on the final product parameters of the readily manufactured component carrier. However, the final product parameters are not directly input as input parameters into a manufacturing device by a user. After said definition, a ranking of at least part of the process parameters may be carried out, wherein process parameters having a stronger impact on the final product parameters may be ranked higher or may be ranked as more relevant than other process parameters having a lower impact on the final product parameters. An assessment in terms of said ranking may for instance be made based on modeling, theoretical calculations, empirical data, and/or expert knowledge. On the basis of said ranking, the volume of the data space may be reduced by a data compression process which selects only a subset of the process parameters which will be used for a subsequent AI-based evaluation. Other lower ranked process parameters may be disregarded for the further processing. Preferably, the most relevant process parameters in terms of their impact on the final product parameters may be selected for further analysis. Only said subset of most relevant process parameters may then be input to an artificial intelligence module, which may for instance have a neural network. The artificial intelligence module may then focus on the selected higher-ranked process parameters for determining or searching for an appropriate action plan or manufacturing concept. In particular, the artificial intelligence module may determine proper values for the selected process parameters in order to achieve a proper (or even optimal) compliance with the defined set of final product parameters. The action plan may thus be based on values of a subset of process parameters determined by the artificial intelligence module based on the pre-filtered input thereof in order to determine a manufacturing plan which properly fulfills the demands in terms of the defined set of final product parameters. When an actual manufacturing process for manufacturing component carriers uses a set of values for the selected process parameters according to the output of the artificial intelligence module, it may be possible to obtain readily manufactured component carriers with properties being sufficiently similar to the initially defined set of final product parameters.

Advantageously, such an AI-based determination of a manufacture plan for manufacturing component carriers may be continuously improved by a proper training (which may include a self-training) of the artificial intelligence module. The described concept of developing a proper component carrier manufacturing process may be based on a big data approach, i.e., the more data will be supplied to the system, the more efficiently and accurately the system will work. Hence, exemplary embodiments provide an efficient solution for integrated problems in terms of manufacturing component carriers. In particular, a proactive system for manufacturing and quality control may be provided. The system may have a user-friendly interface, and may be easily operable and implementable. Furthermore, said system may be easy to proliferate to various issues in terms of planning component carrier manufacture.

In the following, further exemplary embodiments of the method, the apparatus, the computer-readable medium, and the program element will be explained.

As mentioned above, the method may comprise selecting a subset of higher ranked process parameters. In an embodiment, such a subset may be just a minority of all process parameters, or it may also be a majority of or even all process parameters.

In an embodiment, the method comprises categorizing the process parameters into multiple categories, each category relating to an assigned manufacturing stage of the manufacturing method. Not all process parameters of a component carrier manufacturing process will have an impact or a sufficiently strong impact on each and every manufacturing stage. For instance, at least partially different sets of process parameters may be relevant for a plating process than for a laser drilling process, for a lamination process, for a component embedding process, and for a surface finish process. Therefore, more appropriate results may be obtained when the process parameters are grouped into different categories, wherein all process parameters of a certain group or category may have a particularly strong input on an assigned manufacturing stage. Hence, more meaningful results may be achieved by such a categorization since the input to the artificial intelligence module may be even more process stage-related.

In an embodiment, the method comprises carrying out the ranking based on the categorized process parameters. Hence, categorization or classification may be carried out before the ranking. In other words, the process of ranking may be carried out after the process of categorization. For example, a ranking may be carried out individually for each category. Such as process-related sorting before ranking may render the input to the artificial intelligence module more specific and its output more reliable and meaningful.

In an embodiment, the method comprises categorizing based on at least one of the group consisting of expert knowledge and modelling. For instance, a set of expert rules may be defined and applied as a basis for the categorization. For instance, such an expert rule may indicate that an electrically conductive trace thickness (as an example for a process parameter) is strongly influenced by a plating process (as an example for a manufacturing stage category). Such expert rules may be applied for categorizing. Also, theoretical and/or empirical models, calculation and/or data may be applied as a basis for the categorization.

In an embodiment, the method comprises validating the output of the artificial intelligence module and determining the action plan based on the validated output. In other words, the result of the AI-analysis may be further evaluated for verifying whether the defined set of final product parameters can be in fact obtained to a sufficient degree with the output of the AI-analysis. If yes, the output can be accepted as a basis for a validated action plan. If no, the output of the artificial intelligence module may be further modified for improving compliance with the defined set of final product parameters. For instance, the output may be made subject of a further iteration using again the artificial intelligence module. By this validating procedure, the capability of the action plan for meeting the requirements of the defined set of final product parameters may be further improved.

In an embodiment, validating comprises determining whether an output of the artificial intelligence module (for instance a proposed action plan) meets at least one predefined compliance or quality criterion, and if not, modifying the output of the artificial intelligence module (for instance, modifying the proposed action plan) for meeting the at least one predefined compliance or quality criterion. Thus, the validation process may apply one or more compliance or quality criteria to the determined AI output for assessing, for instance, whether or not the determined draft action plan is in compliance with a predefined specification for the component carriers to be manufactured. For example, it may be assessed whether the determined action plan is in line with the set of predefined final product parameters indicating target properties of the component carriers to be manufactured. If the agreement is not considered sufficient in view of the at least one compliance or quality criterion being not matched or not matched to a sufficient degree, the determined action plan may be further modified.

In an embodiment, the ranking of the process parameters is carried out based on at least one of the group consisting of regression significant, correlation, and process knowledge. A regression analysis may be based on a set of statistical processes for estimating the relationships between a dependent variable (which may be the final product parameters) and one or more independent variables (which may be the process parameters). A correlation analysis may assess a statistical association. Process knowledge may relate to technical know-how and/or experience with historical manufacture of component carriers. Additionally or alternatively, other numeric analysis tools may be used as well for refining the ranking.

In an embodiment, processing by the artificial intelligence module comprises processing by deep learning. Deep learning may particularly denote machine learning methods based on artificial neural networks with representation learning. Deep learning can be supervised, semi-supervised or unsupervised. Examples of deep learning architectures, which may be implemented according to exemplary embodiments of the invention, are deep neural networks, deep belief networks, recurrent neural networks and convolutional neural networks. The implementation of deep learning algorithms in the determination of an action plan for manufacturing component carriers may further improve the reliability, performance and accuracy of the determined action plan.

In an embodiment, processing by the artificial intelligence module comprises processing by a neural network. Such a neural network may be a computing system which may be capable of learning to perform tasks by considering examples, generally without being programmed with task-specific rules. A neural network may be based on a collection of connected nodes called artificial neurons. Each connection between said neurons can transmit a signal to other neurons. An artificial neuron that receives a signal then processes it and can signal neurons connected to it. During learning, the weights of the connections may be continuously adjusted. By inputting the ranked and selected process parameters, the neural networks can determine an action plan in proper compliance with the constraints defined by the target or final product parameters.

In an embodiment, the final product parameters describe physical properties of the manufactured component carrier. More specifically, the final product parameters define target parameters which a component carrier manufactured in accordance with the action plan to be determined should have. In particular, the final product parameters may be non-adjustable during the manufacturing method. More specifically, it is possible that the final product parameters cannot be freely adjusted when designing the manufacturing process, but are in contrast to this the result of the execution of a manufacturing process using directly adjustable process parameters. For instance, the final product parameters comprise a shrinkage (for instance of resin of electrically insulating layer structures of the component carrier during curing), a coefficient of thermal expansion (for instance an average CTE value of a laminated layer stack of the component carrier), an impedance and/or a resistance and/or a capacitance (for instance of electrically conductive traces carrying signals during operation of the component carrier), a thickness of the component carrier (in particular of a laminated layer stack thereof), an alignment (for instance a layer-to-layer alignment between vias of adjacent layers), and a land coplanarity (i.e. a deviation of lands or pads on a main surface of the stack from a horizontal orientation).

In an embodiment, the process parameters describe characteristics of the manufacturing process for manufacturing component carriers. More specifically, the process parameters may be directly adjustable during the manufacturing method. Thus, the process parameters may be design parameters that can be modified or freely selected when executing a manufacturing method. For example, the process parameters may be a trace thickness and/or a trace width (for instance of an electrically conductive trace of the component carrier formed by patterning of a copper foil), an insulator thickness (for instance a thickness of a prepreg or FR4 layer of the component carrier), a pad diameter (for instance the diameter of a circular copper structure connected to a via), a via (such as a copper filled mechanically drilled or laser drilled vertical through connection), a temperature and/or a pressure (for instance applied during lamination of layer structures of a layer stack of the component carrier), a processing time (for instance a plating time), an etch rate (for instance for etching a laminated dry film), and a concentration (for instance a copper concentration in a galvanic plating bath).

In an embodiment, the method comprises discarding another subset of lower ranked process parameters for the selection and/or the processing by artificial intelligence and/or the action plan determination. Taking this measure may result in a significant reduction of the data volume to be processed, so that the computational burden of the artificial intelligence module can be reduced. In particular, this data reduction may be carried out by disregarding less significant (according to the previous ranking) data so that no significant loss of information will occur due to this reduction of the data volume.

In an embodiment, data obtained during carrying out the method may be used for training a neural network of the artificial intelligence module. For instance, said data may be stored as training data in a database and may be used for training the artificial intelligence module. By introducing such data from previous component carrier manufacture planning methods into the artificial intelligence module, the performance of the artificial intelligence module (for instance of a neural network thereof) may be continuously improved. In other words, the output of the method and apparatus may be synergistically used as highly valuable training data for the artificial intelligence module.

In an embodiment, the method comprises analyzing, preferably adjusting, the input selected subset of process parameters by the artificial intelligence module so that the output of the artificial intelligence module provides instructions relating to the manufacturing method for obtaining component carriers complying with the defined set of final product parameters. For instance, a neural network may be configured or trained for deter-mining an appropriate set of process parameters which, when used as a basis for a manufacturing process for manufacturing component carriers, result in component carriers meeting the constraints of the final or target product parameters. In other words, the goal of the processing by the artificial intelligence module may be the determination of a set of highest ranked and preferably manufacturing stage-specific process parameters which can be fed as an instruction input to the artificial intelligence module so that component carriers with the desired properties are obtained.

In the following, further properties of the semifinished or manufactured component carriers, as well as further aspects of the manufacturing process will be described.

In an embodiment, the component carriers comprise a stack of at least one electrically insulating layer structure and at least one electrically conductive layer structure. In the context of the present application, the term "layer structure" may particularly denote a continuous layer, a patterned layer, or a plurality of non-consecutive islands within a common plane. A layer structure may be electrically insulating and/or electrically conductive. For example, the component carriers may be a laminate of the mentioned electrically insulating layer structure(s) and electrically conductive layer structure(s), in particular formed by applying mechanical pressure and/or thermal energy. The mentioned stack may provide plate-shaped component carriers capable of providing a large mounting surface for further components and being nevertheless very thin and compact.

In an embodiment, the component carriers are shaped as a plate. This contributes to the compact design, wherein the component carriers nevertheless provide a large basis for mounting components thereon. Further-more, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carriers, which may be formed on the basis of a panel, is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, each of the above-mentioned electrically insulating layer structures comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon is a registered mark of The Chemours Company FC of Wilmington, Del., U.S.A. Reinforcing structures such as webs, fibers, or spheres, for example made of glass (multilayer glass) may be used as well. Although prepreg particularly FR4 is usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, each of the above-mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. The at least one component can in particular be selected from a group consisting of an electrically non-conductive inlay (such as a ceramic inlay, preferable comprising aluminum nitride or aluminum oxide), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration.

The component may be surface mounted on the component carrier and/or may be embedded in an interior thereof.

In an embodiment, the component carriers are laminate-type component carriers. In such an embodiment, the component carrier is a compound of multiple layer structures which are stacked and connected together by applying a pressing force and/or heat.

After processing interior layer structures of the semifinished component carriers, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
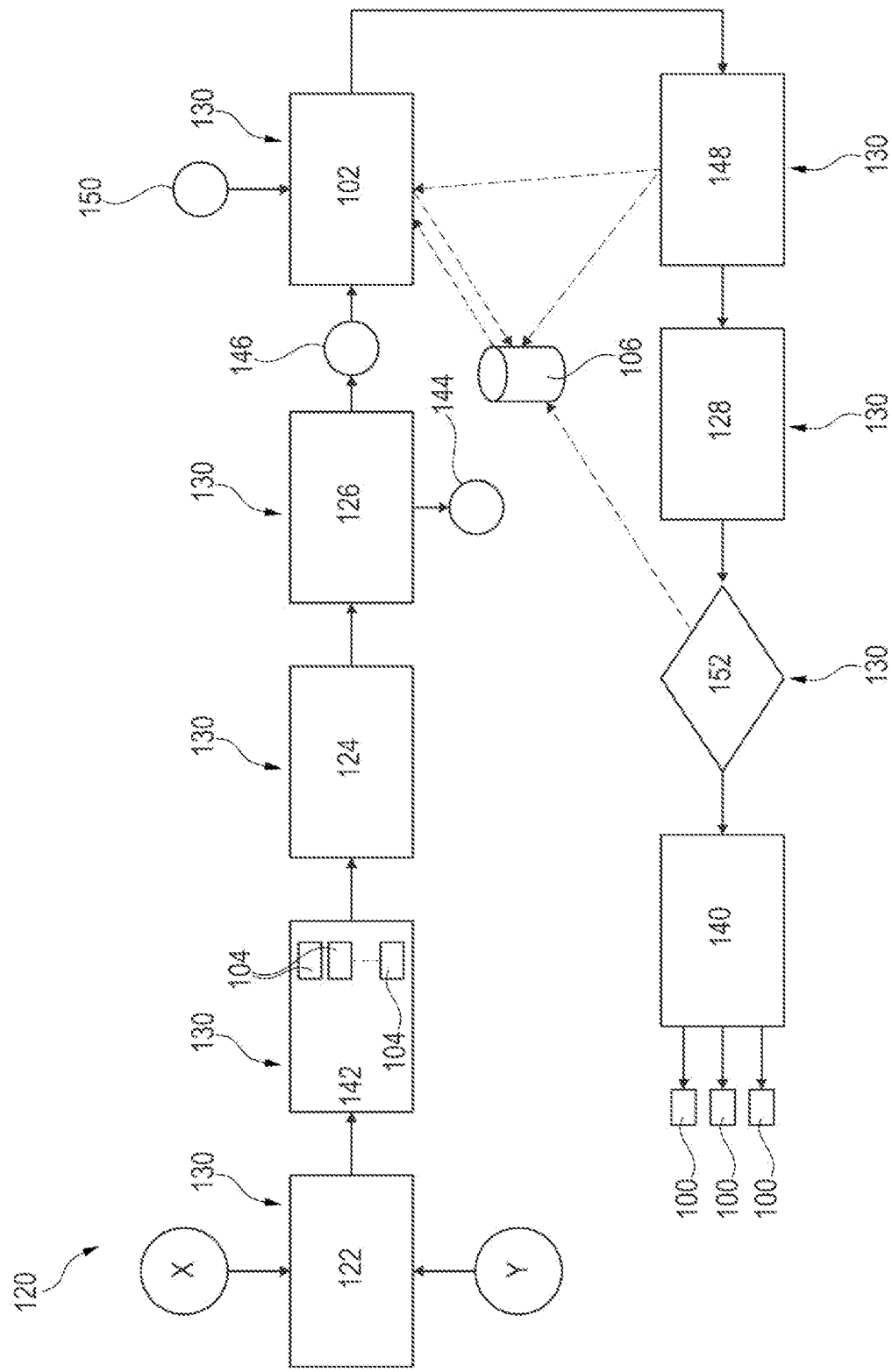
FIG. 1 illustrates an apparatus for determining an action plan for manufacturing component carriers according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

In IC (integrated circuit) substrate or PCB (printed circuit board) manufacturing, many products need around 50 or more days and have to pass about 300 or more process steps before shipment. Nevertheless, some of integrated problems which were caused in the front end only can be detected at the end of the line. Once such a problem occurs, it may have an impact on many other products in the pipeline, and it may be difficult to find out the root cause.

During the manufacture of component carriers on panel level, the panel will go through the process from panel level to quarter level, and then further to single unit level. A layout may show criteria indicated on quarter panel level or single unit level, but contribution factors may come from the entire processes, thus it is a tough integration topic. Phenomena such as shrinkage with an impact on layer-to-layer alignment, land coplanarity, area thickness variation, area warpage, impendence, resistance, substrate thickness, etc., have an impact across multiple different processes.

In order to tackle these and other issues, a proactive manufacture planning system is provided according to an exemplary embodiment of the invention, combining an artificial intelligence (AI) module (such as a neural network) with substrate big data. In this context, substrate data may denote one or more character parameters of criteria of quality and engineering related parameters. Engineering related parameters may be for instance geometrical parameters (for instance a thickness) of an electrically insulating layer structure (for instance made of ABF), geometrical parameters of an electrically conductive layer structure (such as a copper trace width, copper thickness, etc.) in a component carrier (such as an IC substrate). The meaning of this term may however be expanded to engineering parameters like Q-time, copper density, substrate via quantity, etc. In an embodiment, it may be possible to set up simulation models for process input and/or output parameters to control to avoid or reduce excursion and deviation in an early stage. Such an embodiment can automatically and continuously learn the data/process relationship, may execute self-training and may validate the training model by new data and experience. The more data is provided or is accumulated over time, the better will be the accuracy of the model. Hence, an AI-based proactive process control system may be provided as a solution package for those various factors, cross-function processes, and high integration technology problems. Such an AI-based solution may overcome high integration technology problems which are caused by various factors and cross-function processes for reducing excursion and deviation. AI may thus be integrated in PCB manufacture to improve learning and data processing capabilities. To be highly effective, said application of AI may be used with big data sets in the initial training of the AI algorithms (for example deep learning, recurrent neural networks, etc.). In particular, AI integrated with a neural network may be combined with big data methodology. Thus, a result orientated platform may be provided for guiding proactive compensation in subsequent processes. Such a deep learning and continuous self-learning simulation model with a "What You See Is What You Get" characteristic may be efficiently employed to simplify sophisticated technology to easy execution.

FIG. 1 illustrates an apparatus 120 for determining an action plan for manufacturing component carriers 100 according to an exemplary embodiment of the invention.

The apparatus 120 comprises a receiving unit 122 configured for receiving a defined set of final product parameters Y which are target parameters (or parameters to be predicted) for a component carrier 100 to be manufactured and which are influenceable by a set of process parameters X. The defined set of process parameters X, which is also received by receiving unit 122, is directly influenceable or settable or adjustable during manufacturing the component carriers 100. Thus, also the set of process parameters X may be input to the receiving unit 122. The final product parameters Y describe physical properties of the readily manufactured component carrier 100. Thus, the final product parameters Y are non-adjustable during the manufacturing method, but are the result thereof. In contrast to this, the process parameters X are directly adjustable as freely selectable design parameters during the manufacturing method. Examples for the process parameters X are properties of constituents used for forming a layer stack (such as trace width, insulator thickness, pad diameter, via diameter), a temperature and/or a pressure during lamination, a processing time during plating, an etch rate during patterning, a concentration of a chemical agent used for instance during plating, etc. Examples for the final product parameters Y comprise a shrinkage behavior or characteristic of resin of the layer stack, an average coefficient of thermal expansion (CTE) of the stack, an impedance and/or a resistance of created electrically conductive traces, a land coplanarity (i.e., an obtained level of warpage), etc.

In one practical example, a certain property in terms of land coplanarity shall be achieved. Land coplanarity of a component carrier 100 may relate to the goal that multiple lands or pads on a main surface of a component carrier 100 shall all lie in a common plane. In view of warpage and other artefacts, different lands or pads on the main surface of the component carrier 100 may in reality lie outside a target plane. Usually, it may be desired that land coplanarity is sufficiently small, for instance below a predefined threshold value. Hence, a certain level of land coplanarity may be a target or final product parameter Y to be achieved by component carriers 100 manufactured using a designed manufacturing method. In order to influence and finally adjust land coplanarity, appropriate adjustable process parameters X may be a width and a thickness of electrically conductive traces (such as a patterned copper foil) of a layer stack of the component carrier 100, as well as a thickness of electrically insulating layer structures (in particular prepreg sheets, ABF sheets, etc.). By setting, adjusting, modifying or applying these and/or other process parameters X in a manufacturing method, the mentioned and/or other final product parameters Y may be obtained in a respective readily manufactured component carrier 100. The determination of such a set of process parameters X to be used for a manufacturing method resulting in component carriers 100 having product parameters Y may be the goal of the method.

In a categorization unit 142, the defined set of process parameters X may be categorized into multiple categories 104, wherein each category 104 may correspond to an assigned manufacturing stage of the manufacturing method. For instance, one category 104 may include a subset of process parameters X being particularly relevant for a laser drilling process, another category 104 may include another subset of process parameters X being particularly relevant for a lamination process, and yet another category 104 may include a further subset of process parameters X being particularly relevant for a plating process. For instance, the categorization may be made on the basis of expert knowledge (for instance using expert rules and/or empirical data from a database) and/or by applying a theoretical and/or empirical model.

The categorized process parameters X may then be supplied to a ranking unit 124 configured for ranking the categorized process parameters X concerning their impact on the final product parameters Y. Said ranking may be carried out, for example, by applying a numerical model such as regression significant, correlation, and/or process knowledge. By this ranking, the process parameters X may be ordered, for instance individually for each category 104, in accordance with their relevance and impact on the final product parameters Y.

A selection unit 126 may then receive the ranked process parameters X as an input and may select therefrom a subset of higher ranked process parameters X. The selected subset of process parameters X is indicated schematically with reference sign 146. The remaining lower ranked process parameters X may then be disregarded for the further analysis. The disregarded or discarded subset of process parameters X is indicated schematically with reference sign 144. For instance, only a predefined number or a predefined percentage of most relevant process parameters X may be selected as an input for a subsequent artificial intelligence module 102. By taking this measure, the amount of data to be processed may be significantly reduced without the loss of significant information. Advantageously, this reduces the computational burden. At the same time, by selectively disregarding less relevant data, the accuracy and relevance of the output of the subsequent artificial intelligence analysis may be improved.

As already mentioned, artificial intelligence module 102 may then be supplied with the selected subset of process parameters X, as well as with the final product parameters Y. The artificial intelligence module 102 may be configured for processing the selected subset of process parameters X in combination with the defined set of final product parameters Y using artificial intelligence, for instance with the task of finding appropriate values of the selected subset of process parameters X which, when used for a manufacturing process for manufacturing component carriers 100, results in component carriers 100 meeting the requirements of the final product parameters Y. Advantageously, the artificial intelligence module 102 may apply deep learning. More specifically, the artificial intelligence module 102 may comprise a neural network for processing the mentioned set of data. For continuously improving its performance, the neural network may be trained by training data 150.

The output of the artificial intelligence module 102, which may be a proposal for an action plan 152 for manufacturing the component carriers 100, may then the input into an optional but advantageous validation unit 148. In the validation unit 148, the output of the artificial intelligence module 102 may be validated or assessed. More specifically, said validating may comprise determining whether the draft action plan 152 meets at least one predefined compliance or quality criterion, and if not, modifying the draft action plan 152 for meeting the at least one predefined compliance or quality criterion. For instance, simulations may be carried out in the validation unit 148 during which process parameters X may be further modified and the impact on the virtually manufactured component carriers (corresponding to the simulation) may be analyzed in terms of the goal of meeting compliance with the final product parameters Y. Modifications of the process parameters X which improve compliance with the final product parameters Y may be accepted, whereas modifications of the process parameters X which deteriorate compliance with the final product parameters Y may be rejected.

Based on the validated output of the validation unit 148, a determining unit 128 may then determine a final action plan 152 for the manufacturing method. The action plan 152 may include a sequence of processes as well as a set of parameter values (in particular of process parameters X) to be used for a method of manufacturing component carriers 100, in order to achieve compliance of the readily manufactured component carriers 100 with the defined set of final product parameters Y. In other words, the action plan 152 is indicative of how to carry out the manufacturing method to achieve compliance with the defined set of final product parameters Y.

Advantageously, data obtained during carrying out the method (for instance data obtains by the AI processing, during validation, etc.) may be stored in a database 106 and may be used for training and thereby further improving the artificial intelligence module 102. Additionally or alternatively, such data may also be used for further improving operation of the validation unit 148 (for example if validation is made based on known-good combinations, or some kind of AI processing).

As shown in FIG. 1 as well, the apparatus 120 comprises a manufacturing device 140 configured for manufacturing the component carriers 100 based on the determined action plan 150. As a result, component carriers 100 meeting the requirements of the final product parameters Y can be obtained.

In FIG. 1, elements denoted with reference sign 130 may be embodied as one of more processors (such as a microprocessor or a central processing unit, CPU), or part thereof.

Figure 2:
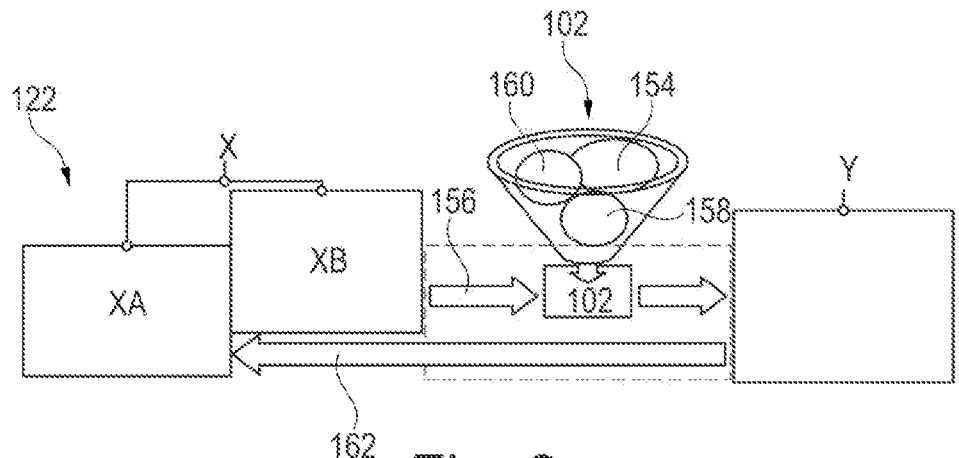
FIG. 2 schematically illustrates part of a method of planning manufacture of component carriers according to an exemplary embodiment of the invention.

FIG. 2 illustrates part of a method of planning manufacture of component carriers 100 according to an exemplary embodiment of the invention.

The scheme according to FIG. 2 shows various process parameters X which can be adjusted during the manufacturing process. The process parameters X can be further separated into product-related process parameters XA, being indicative of physical parameter values selected for the component carriers 100 to be manufactured, and process condition parameters XB, being indicative of process conditions during the manufacturing process. Examples for the product-related process parameters XA are trace thickness, trace width, insulator thickness, pad and/or via diameter, core/buildup layer shrinkage, etc. Examples for the process condition parameters XB are temperature and/or pressure (for instance during lamination), processing time (for example during plating), etch rates (for instance during patterning), chemical concentrations (for instance of a plating bath used during plating), etc. Descriptively speaking, the process parameters X indicate which factors are actually present and may be actively defined for the manufacturing process. In contrast to this, the final product parameters Y described a target result of the manufacturing process, in particular in terms of defects or tolerances. Examples for the final product parameters Y are a shrinkage behavior, thickness variations, warpage, impedance, resistance, overall thickness, layer-to-layer alignment, land coplanarity, etc.

The process parameters X, in particular the process condition parameters XB, may be input into the artificial intelligence module 102 in the context of a defined project target (compare reference sign 156). The artificial intelligence module 102 can work to find a manufacturing process in which final product parameters Y can be obtained, at least within for instance predefined acceptable ranges. The artificial intelligence module 102 may apply elements of artificial intelligence such as one or more neural networks 154, regression analysis 158, fuzzy logic 160, etc. The results of the application of artificial intelligence may result in a process compensation 162, for instance a modification of at least part of the process parameters X, in particular of the product-related process parameters XA.

Traditionally, manufacture defects or excursions trigger engineers to investigate each individual process for correlation or commonality finding, make failure analysis and take containment action. But on the huge plurality of integrated problems during component carrier manufacture, which problems can be detected sometimes only at the end of the line, this traditional response may impact hundreds of lots in the pipeline and introduce high risk for throughput, yield and quality.

In order to overcome such conventional shortcomings, the illustrated exemplary embodiment of the invention combines AI (in particular implementing a neural network 154) with process knowledge to work out a simulation model by deep learning and self-learning substrate big data, and sets up an AI-based proactive process control system for component carrier manufacture in order to ensure that parameters are in optimum ranges for predictably ensuring product quality and preventing excursion.

Again referring to FIG. 2, known numbers may be input and output parameters of the artificial intelligence module 102. An advantageous aspect is that, if the correlation or relationship between input and output is clear and if big data and AI methodology are used, it may be possible to control the input to drive a proper output and use a predicted result (in form of final product parameters Y) to help to set or adjust the influenceable factors (in form of the process parameters X). Consequently, it may be possible to set up a dynamic and stable process control. In other words, it may be possible to simulate relationship between process input and output by artificial intelligence. One concept which may be applied in this context is that, when predicting the final result of the manufacturing process, it may be accepted if the results are satisfactory. In contrast to this, a modification may be carried out if the results are not or not sufficiently satisfactory. Such an artificial-intelligence based system of manufacturing component carriers 100 may be highly efficient, user-friendly and easy to scale.

Figure 3:
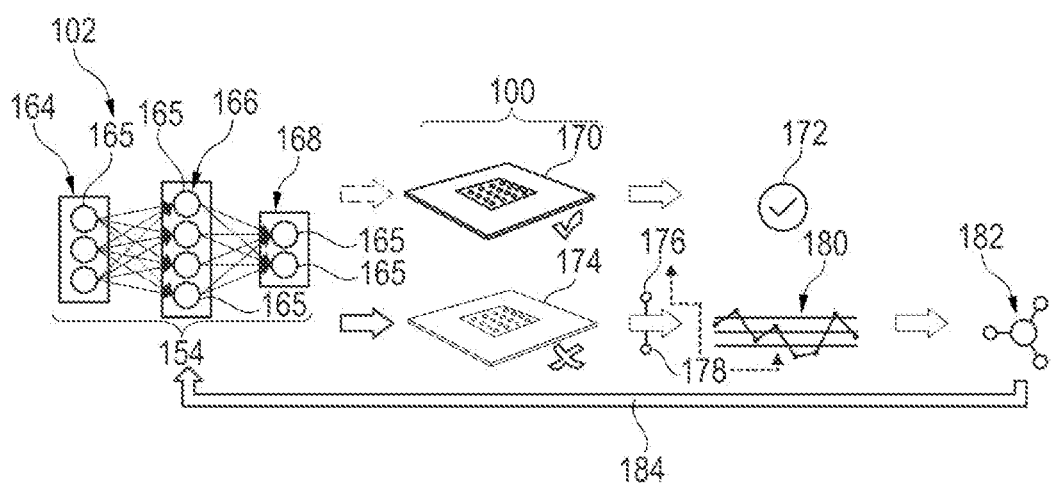
FIG. 3 illustrates part of a method of planning manufacture of component carriers according to an exemplary embodiment of the invention.

FIG. 3 illustrates part of a method of planning manufacture of component carriers 100 according to an exemplary embodiment of the invention.

In FIG. 3, a neural network 154 is shown as an example for an artificial intelligence module 102, for instance configured for providing a deep learning and self-learning function. The illustrated neural network 154 has an input layer 164, a hidden layer 166 and an output layer 168. It is also possible that multiple hidden layers 166 are present between the input layer 164 and the output layer 168. The presence of one or preferably more hidden layers 166 increases the level of intelligence involved by the neural network 154. Input values to the various neurons 165 of layers 164, 166, 168 may be entered into the calculation scheme of neural network 154 in a weighted manner. For instance, higher ranked process parameters X (according to the ranking provided by or determined from the ranking unit 124) may be assigned a higher weight compared to lower ranked process parameters X. Each neuron 165 can be programmed to calculate an output value based on its input values and based on a bias value. The shown neural network 154 is a feedforward neural network, wherein other types of neural networks (such as a feedback neural network) may be used in other embodiments as well. Tasks which may be fulfilled by the neural network 154 in terms of the determination of an action plan 152 for manufacturing component carriers 100 are classification, regression, clustering, and/or the reduction of the amount of data to be processed.

The shown neural network 154 may be a feedforward neural network. The network starts from the input layer 164. Each neuron 165 will receive the information for the former layer and will meanwhile transform the information to the next layer. This may end at the prediction subject (Y). The IC substrate-based example or any other embodiment may however also use a feedback neural network, belonging to a kind of feedback dynamics system. In a feedback neural network, each neuron simultaneously feeds its output signal back to other neurons as an input signal. Hence, it may take a while to stabilize to achieve a desired prediction target.

As shown, a certain component carrier 170 for which the artificial intelligence module 102 predicts good quality, can be released (see reference sign 172). In contrast to this, a specific component carrier 174 for which the artificial intelligence module 102 predicts a poor quality, can be classified as waste (see reference sign 176), can be put on hold together with its entire assigned lot (see reference sign 178), or can be made subject of a factor compensation (see reference sign 180), and can be accepted after successful compensation and verification (see reference sign 182). In terms of compensation and verification, a feedback loop 184 may be implemented which reintroduces an obtained parameter set into the artificial intelligence module 102 for further improvement in a subsequent iteration.

The on-hold-lot 178 according to reference sign 178 can then be compensated (see reference sign 180) or discarded (see reference sign 176), as indicated by dashed lines in FIG. 3.

Hence, in order to apply the AI-based proactive process control system according to an exemplary embodiment of the invention, once a training model is fixed, the predicted Y-results may guide the proposal X used in the manufacturing process. On the other hand, if predicted Y-results shift from a target caused by X-factor excursion, an operator (such as an engineer) can respond to the downstream process parameters based on a compensation proposal provided by the AI-based proactive process control system. Meanwhile, the triggered product may be on hold until an action is done. This may be denoted as a dynamic predict-adjust function loop.

Figure 4:
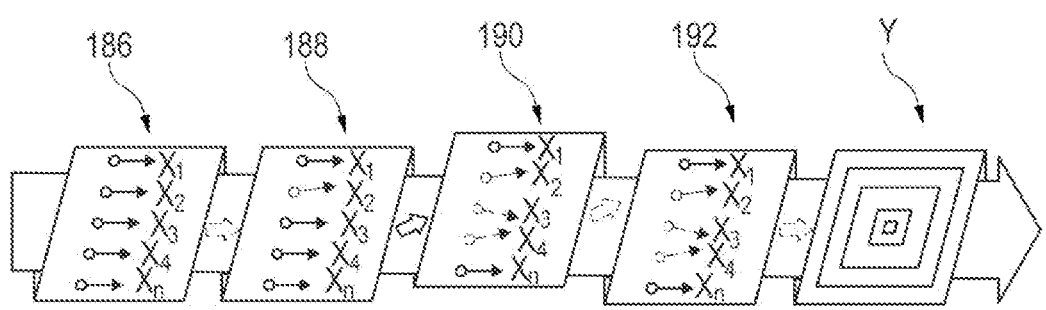
FIG. 4 illustrates part of a method of planning manufacture of component carriers according to an exemplary embodiment of the invention.

FIG. 4 illustrates part of a method of planning manufacture of component carriers 100 according to an exemplary embodiment of the invention.

As can be taken from reference sign 186, an initial manufacturing plan can be designed based on a set of process parameters X, in the shown example X1, X2, X3, X4 and X5.

As can be taken from reference sign 188, a predicate for detection of the artificial intelligence module 102 may indicate that process parameter X2 is out of control, out of specification or has another kind of problem.

As can be taken from reference sign 190, the artificial intelligence module 102 may calculate a proposed virtual compensation for the deviation of process parameter X2. In the shown example, process parameters X3, X4 may be adapted for virtually compensating the deviation of process parameter X2.

As can be taken from reference sign 192, a post compensation of the developed action plan or manufacturing process may then be carried out in the real process.

By taking this measure, the final target in form of the final product parameters may then be complied with.

FIG. 4 illustrates how an AI based proactive process control system according to an exemplary embodiment of the invention works. The shown embodiment combines an AI-neural network method with process knowledge to work out a simulation model by deep learning and self-learning substrate big data, to set up the illustrated AI-based proactive process control system. One part of the system can model process input and output relationship, and provide guidance for input parameters control. Another part of the system can predicate the product result based on a finished step, and an engineer can respond to the downstream process parameters based on a compensation proposal provided by the system. Meanwhile, the triggered product may be on hold until the action is done.

Figure 5:
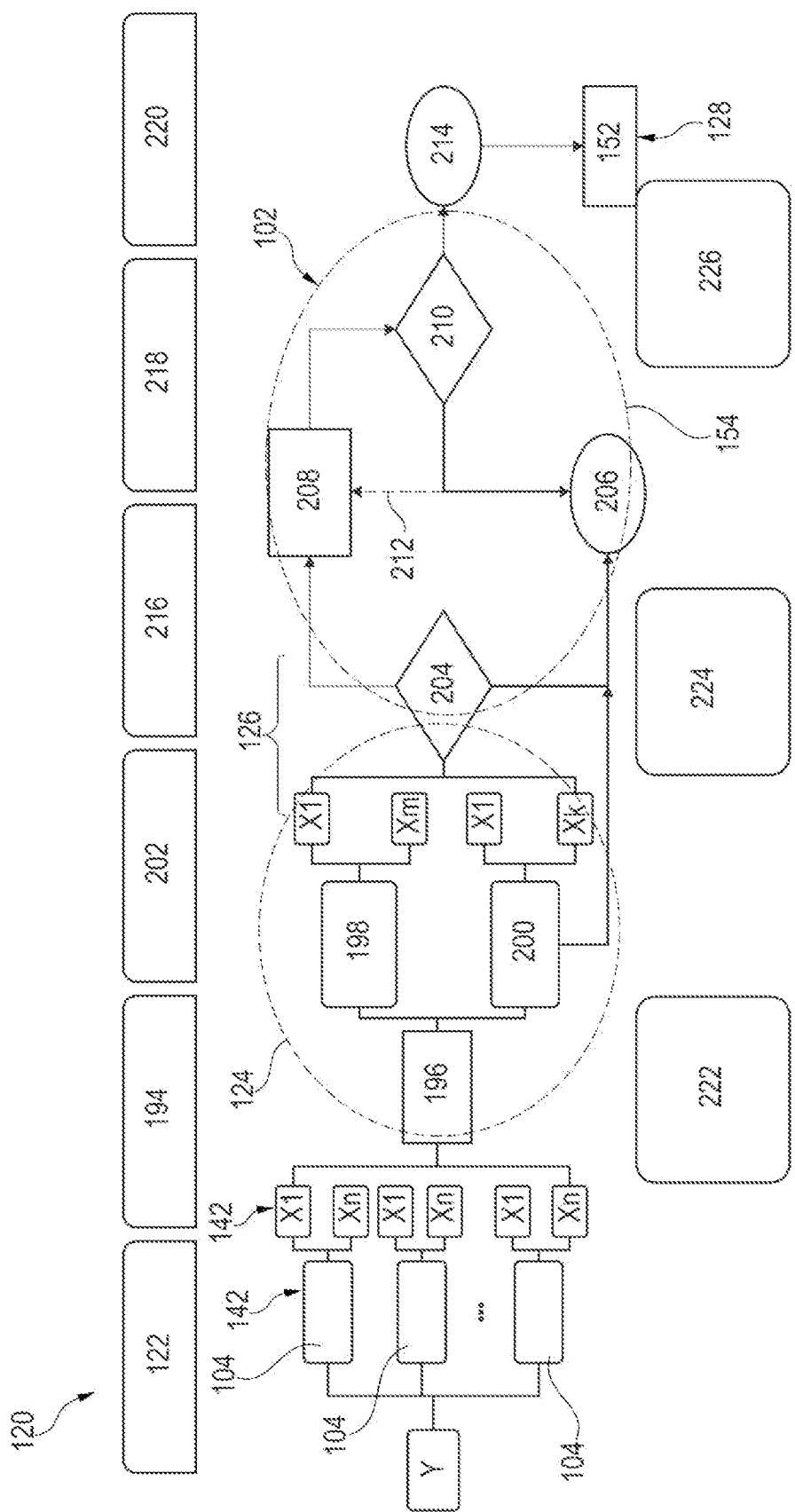
FIG. 5 schematically illustrates elements of an apparatus for and a method of planning manufacture of component carriers according to an exemplary embodiment of the invention.

FIG. 5 schematically illustrates an apparatus 120 for and a method of planning manufacture of component carriers 100 according to an exemplary embodiment of the invention.

Referring to the left-hand side of FIG. 5, the method starts with defining a set of final product parameters Y which are to be predicted for a component carrier 100 to be manufactured. The final product parameters Y define target output parameters of the PCB manufacture process, i.e., are component carrier property parameters to be predicted or to be controlled indirectly. The final product parameters Y are influenceable by a set of process parameters X which are directly influenceable during the manufacturing method. In particular, output parameters are defined by receiving unit 122 of apparatus 120 taking into account factory needs.

In a categorization unit 142, the process parameters X are categorized into different categories 104, each category 104 relating to an assigned process during the manufacture of the component carriers 100. For instance, based on models or expert knowledge, it may be determined which of the process parameters X are assigned to a corresponding manufacturing process or stage. This categorization, which may involve process knowledge, may also be denoted as a filtering of input factors, see filter unit 194.

Subsequently, the categorized process parameters X are ranked in a ranking unit 124 concerning their impact on the final product parameters Y. This input ranking, which may also use process knowledge, may involve a mathematical regression analysis 196, a correlation analysis 198 assessing which of the process parameters X are strongly correlated with and/or have a high impact on the final product parameters Y, and process knowledge 200. Descriptively speaking, it may be assessed which processes impact which parameters to which degrees. This process may relate to an initial sorting factors' correlation level unit 202.

Automatic ranking each factor's correlation level may involve a stepwise regression significant method. Stepwise regression may be denoted as an approach to select a subset of effects for a regression model. It can be useful in the parameter selection. In particular, it may be advantageous to use the minimum corrected Akaike Information Criterion (AICc) to choose the best model. It is also possible to use the minimum Bayesian Information Criterion (BIC) to choose the best model. In general, BIC penalizes models with more parameters more than AICc does. For this reason, it leads to choosing more parsimonious models, that is, models with fewer parameters, than does AICc.

In a selection unit 126, a selection of a subset of higher ranked process parameters X may be made. In other words, an amount of data may be reduced by only selecting a part of the process parameters X for the further analysis and as training data 204 for a neural network 154, while discarding (see reference sign 206) less relevant process parameters X. This may significantly reduce the data volume to be processed and may therefore reduce the computational burden while at the same time reliably avoiding the loss of meaningful data thanks to the previous ranking. By ranking and selecting, the number of parameters may be significantly reduced (for instance from 52 to 12).

Thereafter, the artificial intelligence module 102, here embodied as a neural network 154, is involved in the further data processing. For this purpose, the selected subset of process parameters X is input for processing by the artificial intelligence module 102. A training model (see reference sign 208) may be trained using the most relevant process parameters X according to the previous ranking and selection, to thereby trigger an automatic learning process of the neural network 154. A quality analysis may be made in the quality analysis unit 210. By applying a quality criterion (for instance the requirement $R2>0.7$), it may be determined whether data is sent back for repeated training (see reference sign 212), is discarded (see reference sign 206) or proceeds to final modelling 214. The described processes are carried out in terms of modelling 216 and training the model 218. R2 (which may also be denoted as coefficient of determination) is a proportion of variance in a dependent variable that can be explained by an independent variable. Hence, for interpreting the strength of a relationship based on its R2 value, R2>0.7 can be considered as a strong effect size.

Final modelling 214 may include a final verification or validation analysis (see reference sign 220), i.e., an assessment as to whether the output of the artificial intelligence module 102 can be accepted as correct (or sufficiently reliable) or not. During verification of validation, it may be checked whether the determined model is fine. If not, parameters may be changed and/or indexed. If the parameters are fine, an action plan 152 may be established on the basis of the received output of the artificial intelligence module 102.

If the validation is successful, a determining unit 128 determines an action plan 152 as a plan for the manufacturing method to be actually carried out based on an output of the artificial intelligence module 102. In other words, the action plan 152 indicates how the future manufacture of component carriers 100 shall be carried out, i.e., how the process parameters X shall be adjusted to make the final process parameters Y stable.

As can be taken from FIG. 5, three phases 222, 224, 226 can be distinguished during carrying out the entire process.

Phase 1 (see reference sign 222): Use of a significant regression method to screen and filter all factors, and find out those being most important and critical factors. Phase 1 may use a stepwise regression method as an approach to make factors screening and filter out the significant factors (steps according to blocks 122, 194 and 202).

Phase 2 (see reference sign 224): Use big data and neural network 154 to train the model. Phase 2 starts to use the neural network 154 to train the final model (steps according to blocks 216 and 218).

Phase 3 (see reference sign 226): Use more data to validate the model and/or to render the model more accurately. Phase 3 validates the model (step according to block 220).

Figure 6:
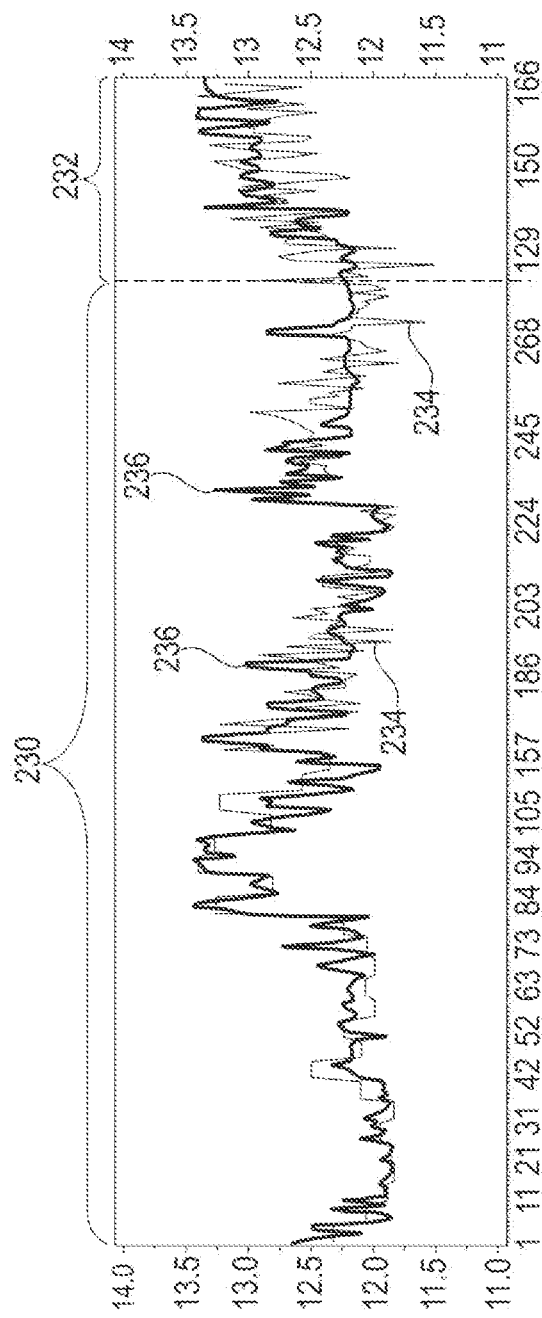
FIG. 6 illustrates processes during carrying out a method of planning manufacture of component carriers according to an exemplary embodiment of the invention.

FIG. 6 illustrates processes during carrying out a method of planning manufacture of component carriers 100 according to an exemplary embodiment of the invention.

More specifically, FIG. 6 shows data obtained during model training (see reference sign 230) and validation (see reference sign 232). In the illustrated graph, actual thickness variation data 234 is compared with predicted thickness variation data 236. Hence, FIG. 6 illustrates self-learning and deep learning big data for model set up. In the shown example, a training set uses data from 237 lots to monitor the final product parameters Y. A validation set uses, in the shown example, data from 46 lots for validating the model. The more data is considered, the better will be the model accuracy. For the training sample, a deviation ratio is 1.37% (wherein a thickness variation bias may be about 0.17). A maximum deviation ratio is 6.50% (wherein a thickness variation bias may be about 0.80). For validating, the deviation ratio is 2.08% (wherein a thickness variation bias may be about 0.25). The maximum deviation ratio is 7.30% (wherein a thickness variation bias may be about 0.90).

In the phase of the method in which the neural network is involved, all suspected process parameters X may be input into this model. By neuron network calculation, deep learning using current input factors may be carried out, and the model can be continuously validated. Consequently, it may be possible to obtain a good accuracy. Meanwhile, it may also be possible to use new data to retrain the model to further improve accuracy of the adjustment. It may also be possible to apply this solution correspondingly to a whole substrate process to set up such a substrate AI-based proactive process control system.

Figure 7:
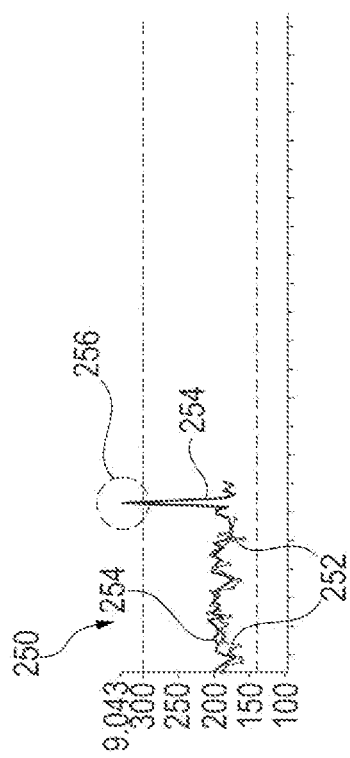
FIG. 7 illustrates changes made by a system of planning manufacture of component carriers for suppressing shrinkage-based artefacts according to an exemplary embodiment of the invention.
Figure 8:
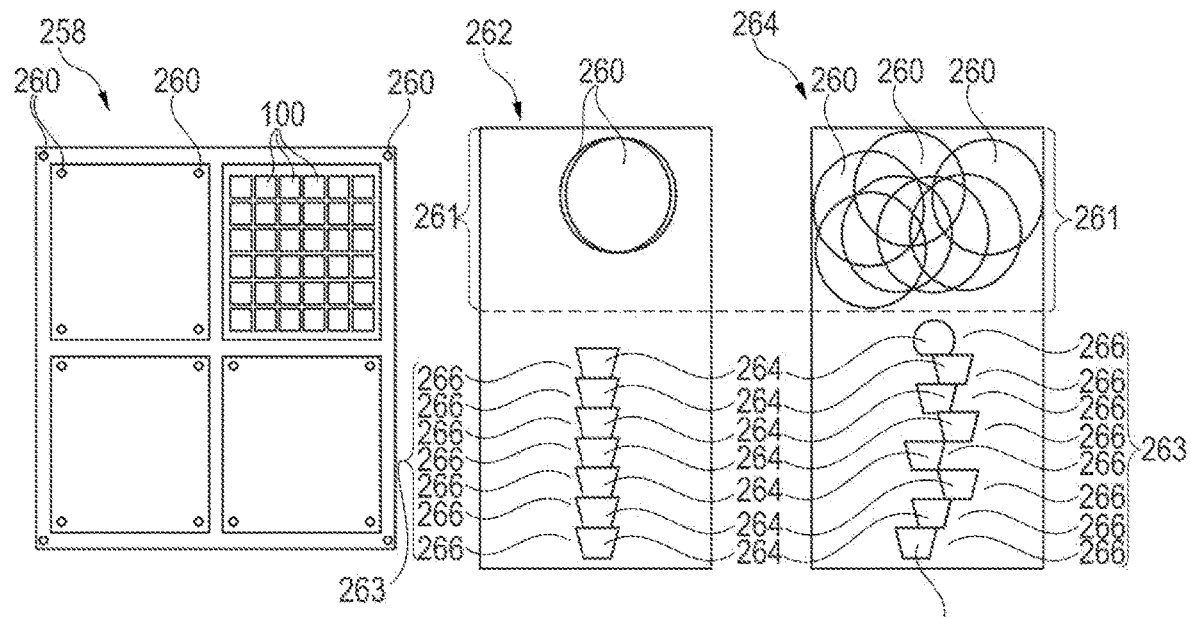
FIG. 8 illustrates a plan view and cross-sectional views of component carriers manufactured after and before making changes according to an exemplary embodiment of the invention, which reduces shrinkage-based artefacts.
Figure 9:
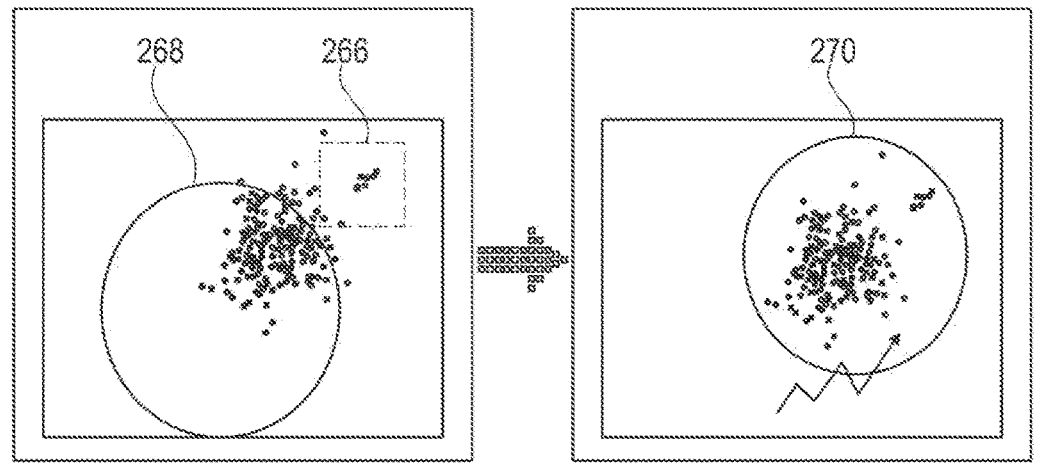
FIG. 9 illustrates changes of shrinkage-based artefacts of component carriers manufactured before and after making changes according to an exemplary embodiment of the invention.

FIG. 7 illustrates changes made by a system of planning manufacture of component carriers 100 for suppressing shrinkage-based artefacts according to an exemplary embodiment of the invention. FIG. 8 illustrates a plan view and cross-sectional views of component carriers 100 manufactured before and after making changes according to an exemplary embodiment of the invention, which reduces shrinkage-based artefacts. FIG. 9 illustrates changes of shrinkage-based artefacts of component carriers 100 manufactured before and after making changes according to an exemplary embodiment of the invention. Shrinkage may occur in electrically insulating layer structures comprising resin during curing, for instance in a prepreg sheet of the component carrier to be manufactured.

FIG. 7 shows a diagram 250 in which a measured shrinkage value 252 is compared with a predicted shrinkage value 254. In a region 256, the predicted shrinkage value is critical or out of control. FIG. 8 shows, on the left-hand side, a plan view of a panel 258 comprising a matrix-like arrangement of multiple component carriers 100 before singularization. Multiple alignment pins 260 are shown as well. The right-hand side of FIG. 8 shows a top view 261 and a cross-sectional view 263 of a region of the panel 258 around one of the alignment markers 260. In a scenario with good shrinkage control and all layers being in alignment shown with reference sign 262 on the left-hand side, shrinkage differences are sufficiently small and layer-to-layer alignment is proper. Correspondingly, electrically conductive layer structures 264 (such as copper filled laser vias, bumps, etc.) in different electrically insulating layer structures 266 are properly aligned between different layers. In another scenario with bad shrinkage control and layer misalignment shown with reference sign 264 on the right-hand side, shrinkage differences of the various electrically conductive layer structures 266 are large which results in a poor layer-to-layer alignment of the various electrically conductive layer structures 264.

Without compensation and referring to the left-hand side of FIG. 9, scrap 266 can occur in the scenario according to reference sign 264 when a predefined fixture is used, see reference sign 268. After taking action and now referring to the right-hand side of FIG. 9, the fixture has been changed in a way as shown with reference sign 270. Correspondingly, there is no longer a risk of scrap 266.

Thus, when the system predicts that the final shrinkage is out of control during an early stage of the process of manufacturing the component carriers 100, and when the matched fixture according to reference sign 270 is not present, this will lead to high scrap (see reference sign 266). Then, the system may hold the corresponding lot before the impact step and inform the impact step to prepare the matched fixture according to reference sign 270 to cover the potential scrap 266 and lead time loss. After the system implementation, there is sufficient time for fixture preparation. The yield and lead time will be improved significantly by implementing matched fixture 270. The shrinkage of substrate or panel 258 in the horizontal and vertical directions according to the left-hand side of FIG. 8, material size and/or scale is or are affected by the raw material and process, and it may further impact on layer-to-layer alignment significantly. Shrinkage, a characteristic of each resin material, can be impacted by multiple processes and parameters. Shrinkage is a sensitive parameter which can be stabilized. During the complex and long process of manufacturing component carriers 100, there may be thousands of factors and cross-factors which may contribute to shrinkage, so that shrinkage may also affect downstream processes.

In the following, it will be described how the shrinkage management can be carried out by an AI-based proactive process control system according to an embodiment of the invention. Based on a proposal from the AI-based proactive process control system, an engineer can understand how much compensation is needed, and which step(s) need(s) to take action. Once the final shrinkage is predicted as out of control (see reference sign 256 in FIG. 7), the system may automatically hold the lot waiting for risk assessment to decide how to compensate or how to dispose the lot. This solution applied to shrinkage not only can predict shrinkage performance but may also guide the process in a very early stage to remove defect loss and reduce process deviation.

Referring to FIG. 9, after the system detects that the final shrinkage is out of control, the system may inform the impact step to prepare the correct fixture to cover the potential scrap and may avoid time loss.

Figure 10:
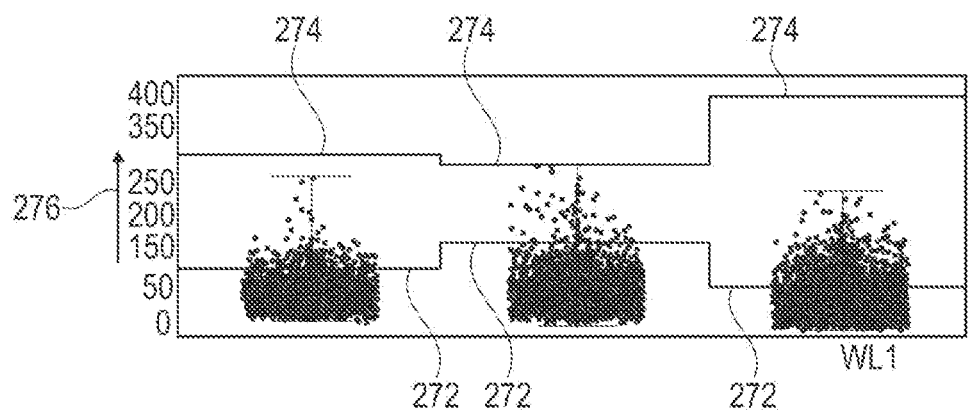
FIG. 10 illustrates changes made by a system of planning manufacture of component carriers for suppressing land coplanarity artefacts according to an exemplary embodiment of the invention.
Figure 11:
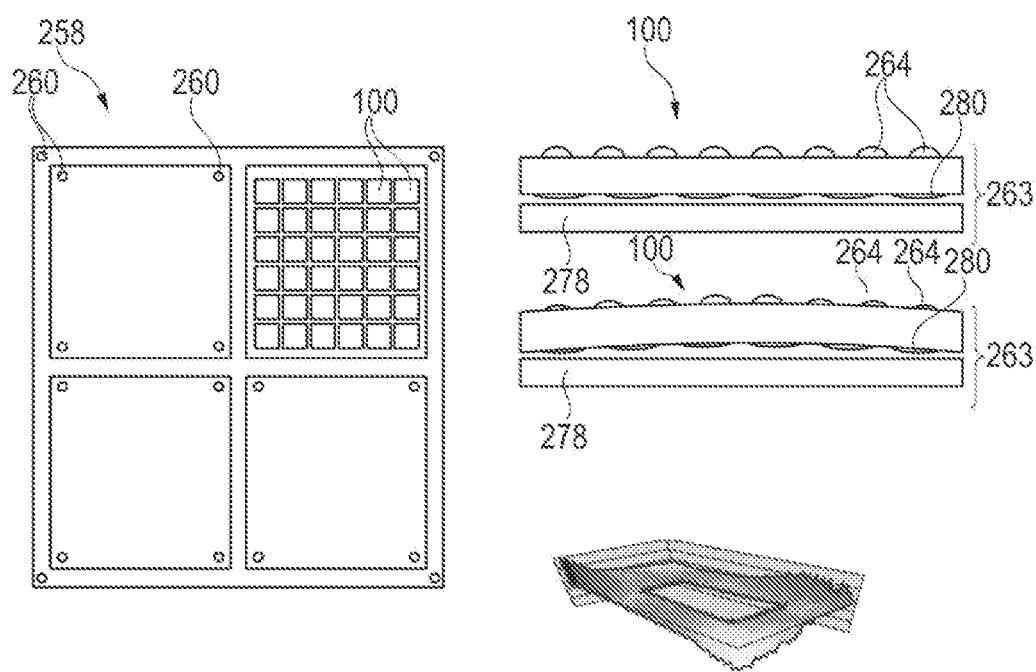
FIG. 11 illustrates a plan view and cross-sectional views of component carriers manufactured after and before making changes according to an exemplary embodiment of the invention, which reduces land coplanarity artefacts.

FIG. 10 illustrates changes made by a system of planning manufacture of component carriers 100 for suppressing land coplanarity artefacts according to an exemplary embodiment of the invention. FIG. 11 illustrates a plan view and cross-sectional views of component carriers 100 manufactured before and after making changes according to an exemplary embodiment of the invention, which reduces land coplanarity artefacts.

FIG. 10 shows coplanarity 276 for different products (such as preforms of component carriers 100) been manufactured. An initial reject limit 274 is higher than a changed reject limit 272. All products above a respective reject limit 272 or 274, respectively, are rejected or classified as waste.

FIG. 11 again shows on the left-hand side a panel 258, as described referring to FIG. 8, and on the right-hand side cross-sectional views 263 of component carriers 100 on a respective pedestal 278. On the bottom of each component carrier 100, attach pads or lands 280 are formed. Generally, it is desired that all lands 280 are coplanar. This is the case in the upper illustration of FIG. 11, but—due to warpage—not in the lower illustration of FIG. 11.

In the shown example concerning land coplanarity (i.e., land coplanarity of component carrier 100 in terms of level warpage), each land 280 shall be attached at a planar bottom on pedestal 278. Land coplanarity is a critical parameter for component assembly processes, i.e., for mounting components on component carrier 100. The system detects some key factors out of control, and the prediction result shows the final land coplanarity will be out of control in the lower components carrier 100 according to FIG. 11. In such a scenario, the system will provide a compensation proposal to bring the final result back to base line. This task can be fulfilled by a proactive control and a simulation to solve the excursion at an early stage.

FIG. 11 hence shows land coplanarity. In simple words, land coplanarity is an indicator of unit level warpage. A panel 258 goes through more than 100 steps during manufacture of component carriers 100, from panel level processing to quarter panel processing, and then dicing to unit level. Land coplanarity is related with multiply processes and factors, even the process environment. Land coplanarity is a complicated indicator for substrate quality. Conventionally, it is not easy to figure out the real contribution factors, excursion responding slowly.

However, by an AI-based proactive process control system according to an exemplary embodiment of the invention, it may be possible to set up a simulation model for input/output parameters and to simulate. This may predict accuracy very well. Land coplanarity is a potential risk for scrap. Historical data and experience may continuously support the model of self-deep learning and validation.

Figure 12:
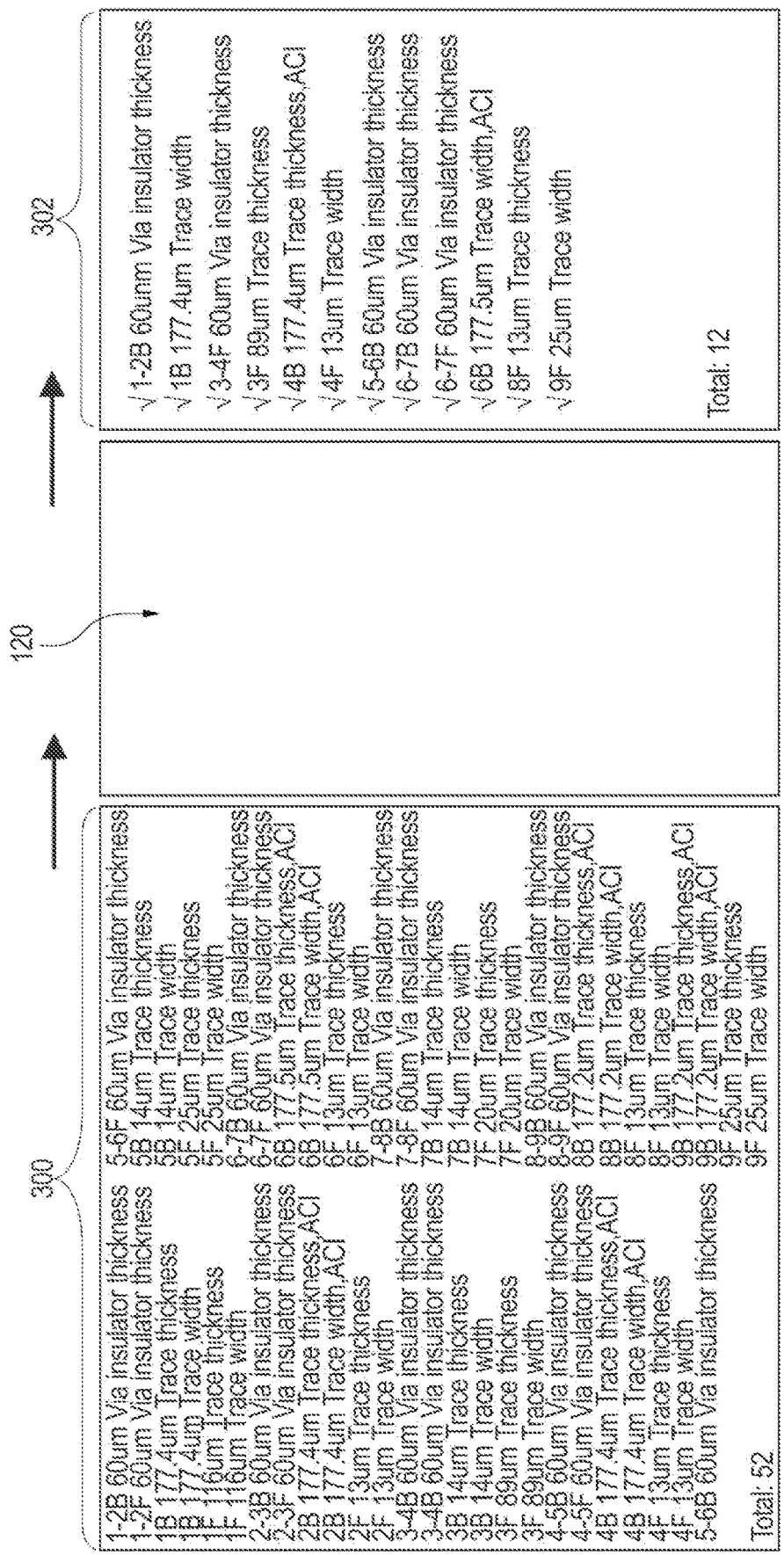
FIG. 12 illustrates a schematic overview of a system for determining an action plan for manufacturing component carriers according to an exemplary embodiment of the invention.

FIG. 12 illustrates a schematic overview of a system for determining an action plan 152 for manufacturing component carriers 100 according to an exemplary embodiment of the invention.

In such a system, a complex input 300 (having 52 input parameters in the shown example) is converted into a simpler output 302 (having 12 output parameters in the shown example) by an apparatus 120 implementing artificial intelligence. The following procedures can be carried out in this context in apparatus 120:

In a first process stage, all potential factors may be selected.

In a second process stage, parameters (for instance maximum parameters) may be entered.

In a third process stage, a regression can be carried out.

The second and the third stages may thus include an auto-ranking of each factor's correlation level.

In a fourth process stage, the system may validate each factor's correlation level and filter the significant factors. It may be decided whether parameters are kept or are rejected.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing component carriers, comprising:
   categorizing process parameters into multiple categories, each category relating to an assigned manufacturing stage of the manufacturing method;
   defining a set of final product parameters as a target for component carriers to be manufactured, wherein the product parameters are influenceable by a set of the process parameters being settable during a manufacturing method;
   carrying out a ranking based on the categorized process parameters,
   wherein the ranking of the process parameters concerns their impact on the final product parameters, with a ranking unit comprising an interface and a processor;
   wherein the process of ranking is carried out after the process of categorization;
   selecting a subset of higher ranked process parameters having a stronger impact on the final product parameters with a selection unit comprising an interface and a processor;
   inputting the selected subset of process parameters for processing by a trained artificial intelligence module comprising an interface and a processor;
   determining an action plan for the manufacturing method based on an output of the trained artificial intelligence module with a determining unit comprising an interface and a processor; and
   manufacturing the component carriers based on the determined action plan when manufacturing the component carriers;

wherein the method comprises discarding a subset of lower ranked process parameters.

2. The method according to claim 1, wherein the categorizing is based on at least one of the group consisting of expert knowledge, modelling, empirical data, and theoretical calculations.

3. The method according to claim 1, further comprising: validating the output of the artificial intelligence module and determining the action plan based on the validated output.

4. The method according to claim 3, wherein the validating comprises determining whether an output of the artificial intelligence module meets at least one predefined compliance criterion, and if not, modifying the output of the artificial intelligence module for meeting the at least one predefined compliance criterion.

5. The method according to claim 1, wherein the ranking is based on at least one of the group consisting of a regression, a correlation, and process knowledge.

6. The method according to claim 1, wherein processing by the artificial intelligence module comprises processing by deep learning.

7. The method according to claim 1, wherein processing by the artificial intelligence module comprises processing using a neural network.

8. The method according to claim 1, wherein the final product parameters describe physical properties of the manufactured component carrier.

9. The method according to claim 1, wherein the final product parameters are not directly adjustable during the manufacturing method.

10. The method according to claim 1, wherein the process parameters are directly adjustable during the manufacturing method.

11. The method according to claim 1, further comprising: discarding another subset of lower ranked process parameters.

12. The method according to claim 1, further comprising: storing data obtained during carrying out the method in a database for training the artificial intelligence module.

13. The method according to claim 1, comprising at least one of the following features:
wherein the process parameters comprise at least one of the group consisting of a trace thickness, a trace width, an insulator thickness, a pad diameter, a via diameter, a temperature, a pressure, a processing time, an etch rate, and a concentration;
wherein the final product parameters comprise at least one of the group consisting of a shrinkage, a coefficient of thermal expansion, an impedance, a resistance, a thickness of the component carrier, an alignment, and a land coplanarity;
wherein the action plan is indicative of how to carry out the manufacturing method to achieve compliance with the defined set of final product parameters;
wherein the method comprises adjusting the input selected subset of process parameters by the artificial intelligence module so that the output of the artificial intelligence module provides instructions relating to the manufacturing method for obtaining component carriers complying with the defined set of final product parameters;
wherein the method comprises manufacturing the component carriers based on the determined action plan.

14. An apparatus for determining an action plan for manufacturing component carriers, the apparatus comprising:
a receiving unit configured for receiving a defined set of final product parameters as a target for component carriers to be manufactured and for receiving a set of process parameters, wherein the product parameters are influenceable by the set of process parameters being settable during the manufacturing method, wherein the receiving unit comprises an interface and a processor;
a categorization unit configured to categorize the process parameters into multiple categories, each category relating to an assigned manufacturing stage of the manufacturing method;
a ranking unit configured for carrying out a ranking based on the categorized process parameters, wherein the ranking of the process parameters concerns their impact on the final product parameters, wherein the ranking unit comprises an interface and a processor;
wherein the ranking is carried out after the categorization;
a selection unit configured for selecting a subset of higher ranked process parameters having a stronger impact on the final product parameters and for discarding a subset of lower ranked process parameters, wherein the selection unit comprises an interface and a processor;
a trained artificial intelligence module with an interface and a processor configured for processing the selected subset of process parameters using artificial intelligence; and
a determining unit comprising an interface and a processor configured for determining the action plan for a manufacturing method based on an output of the artificial intelligence processing;
wherein the action plan is followed when manufacturing the component carriers.

15. The apparatus according to claim 14, wherein the action plan is indicative of how to carry out the manufacturing method to achieve compliance with the defined set of final product parameters.

16. The apparatus according to claim 14, wherein the apparatus is configured to carry out and/or control a method including:
defining a set of final product parameters as a target for component carriers to be manufactured, wherein the product parameters are influenceable by a set of process parameters being settable during the manufacturing method;
ranking the process parameters concerning their impact on the final product parameters;
selecting a subset of higher ranked process parameters;
inputting the selected subset of process parameters for processing by an artificial intelligence module; and
determining an action plan for the manufacturing method based on an output of the artificial intelligence module.

\* \* \* \* \*